(12) United States Patent
Malhotra et al.

(10) Patent No.: US 10,806,212 B2
(45) Date of Patent: Oct. 20, 2020

(54) MULTI-CAPACITOR KINETIC ENERGY GENERATOR

(71) Applicant: NIKE, INC., Beaverton, OR (US)

(72) Inventors: Vikram Malhotra, Portland, OR (US); Kathleen F. Richmond, Seattle, WA (US); Summer L. Schneider, Beaverton, OR (US)

(73) Assignee: NIKE, Inc., Beaverton, OR (US)

( * ) Notice: Subject to any disclaimer, the term of this patent is extended or adjusted under 35 U.S.C. 154(b) by 478 days.

(21) Appl. No.: 15/576,893

(22) PCT Filed: May 26, 2016

(86) PCT No.: PCT/US2016/034308
§ 371 (c)(1),
(2) Date: Nov. 27, 2017

(87) PCT Pub. No.: WO2016/196186
PCT Pub. Date: Dec. 8, 2016

(65) Prior Publication Data
US 2018/0146739 A1    May 31, 2018

Related U.S. Application Data

(60) Provisional application No. 62/168,143, filed on May 29, 2015.

(51) Int. Cl.
*H01L 41/113* (2006.01)
*A43B 3/00* (2006.01)
(Continued)

(52) U.S. Cl.
CPC .......... *A43B 3/0015* (2013.01); *A43B 3/0005* (2013.01); *H02N 2/181* (2013.01);
(Continued)

(58) Field of Classification Search
CPC ....... A43B 3/0015; A43B 3/0005; A43B 5/00; H02N 2/181; H02N 2/183; H04W 4/80; H04W 88/02
(Continued)

(56) References Cited

U.S. PATENT DOCUMENTS 7,081,693 B2    7/2006  Hamel et al.
7,105,982 B1    9/2006  Hagood, IV et al.
(Continued)

FOREIGN PATENT DOCUMENTS

JP      2012023838 A      2/2012
KR   1020140139313 A    12/2014
(Continued)

OTHER PUBLICATIONS

"International Application Serial No. PCT/US2016/034308, International Preliminary Report on Patentability dated Dec. 14, 2017", 9 pgs.
(Continued)

*Primary Examiner* — Thomas M Dougherty
(74) *Attorney, Agent, or Firm* — Schwegman Lundbgerg & Woessner, P.A.

(57) ABSTRACT

A kinetic energy generator, system and method of transmitting data are described. The kinetic energy generator includes a piezoelectric element that receives kinetic energy initiated by a user, a rectifier connected with the piezoelectric element that rectifies voltage from the piezoelectric element, a capacitive system of capacitors formed from different materials connected with the piezoelectric element through the rectifier, a short-range transceiver connected with the capacitive system and activated in response to energy storage in the capacitive system reaching a threshold level, and a non-volatile memory that provides at least some of the data transmitted by the transceiver in response to a
(Continued)

request from the transceiver. Below an inflection point, the capacitive system stores more energy than one system of one capacitor type and less energy than another system of another capacitor type arranged in the same manner as the capacitive system, and the reverse above the inflection point.

15 Claims, 9 Drawing Sheets

(51) Int. Cl.
  *H02N 2/18* (2006.01)
  *H04W 4/80* (2018.01)
  *A43B 5/00* (2006.01)
  *H04W 88/02* (2009.01)
(52) U.S. Cl.
  CPC ............... *H02N 2/183* (2013.01); *A43B 5/00* (2013.01); *H04W 4/80* (2018.02); *H04W 88/02* (2013.01)
(58) Field of Classification Search
  USPC ........................................ 310/318, 319, 339
  See application file for complete search history.

(56) References Cited

U.S. PATENT DOCUMENTS

| | | | |
|---|---|---|---|
| 7,138,911 B2 | 11/2006 | Tyndall | |
| 8,076,825 B1* | 12/2011 | Kaajakari | H02N 2/181 290/1 R |
| 10,361,355 B2* | 7/2019 | Kurikuma | H02M 7/10 |
| 2005/0083134 A1* | 4/2005 | Kapoor | H03F 1/30 330/302 |
| 2006/0237968 A1 | 10/2006 | Chandrasekaran | |
| 2007/0257634 A1* | 11/2007 | Leschin | H02J 7/32 320/107 |
| 2009/0168388 A1 | 7/2009 | Wong et al. | |
| 2010/0090477 A1 | 4/2010 | Keating et al. | |
| 2010/0133954 A1* | 6/2010 | Despesse | H02N 1/08 310/319 |
| 2013/0221802 A1* | 8/2013 | Oh | H02N 2/186 310/319 |
| 2014/0021828 A1 | 1/2014 | Despesse | |
| 2016/0020032 A1* | 1/2016 | Shin | H01G 4/38 174/260 |
| 2016/0020041 A1* | 1/2016 | Ahn | H01G 2/106 363/21.01 |
| 2016/0027594 A1* | 1/2016 | Ahn | H01G 4/228 361/767 |
| 2017/0208890 A1* | 7/2017 | Torvinen | H01L 41/1138 |
| 2018/0048247 A1* | 2/2018 | Gerstenberger | H02J 5/005 |
| 2018/0085030 A1* | 3/2018 | Krimmer | A43B 3/0031 |
| 2018/0125147 A1* | 5/2018 | Folske | H02N 2/181 |
| 2019/0035479 A1* | 1/2019 | Chen | G11C 16/30 |

FOREIGN PATENT DOCUMENTS

| | | | |
|---|---|---|---|
| WO | WO 2012/101037 A1 * | 8/2012 | ............... H02N 2/18 |
| WO | WO-2016196186 A1 | 12/2016 | |

OTHER PUBLICATIONS

"bq25570 Nano Power Boost Charger and Buck Converter for Energy Harvester Powered Applications", Texas Instruments data sheet, (2015), 44 pgs.

"Nanopower Energy Harvesting Power Supply with 14V Minimum Vin", Linear Technology LTC3588-2, (Jul. 8, 2014), 18 pgs.

* cited by examiner

US 10,806,212 B2

MULTI-CAPACITOR KINETIC ENERGY GENERATOR

PRIORITY CLAIM

This application is a U.S. National Stage Filing under 35 U.S.C. 371 from International Patent Application Serial No. PCT/US2016/034308, filed. May 26, 2016, published on Dec. 8, 2016 as WO2016/196186, which application claims the benefit of priority to U.S. Provisional Patent Application Ser. No. 62/168,143, filed May 29, 2015, and entitled "MULTI-CAPACITOR KINETIC ENERGY GENERATOR," which are incorporated herein by reference in their entireties.

TECHNICAL FIELD

Embodiments generally concern a system and method for converting energy generated by a piezoelectric structure exposed to the mechanical energy, into a form suitable for providing electric power for communication electronics.

BACKGROUND

The use of communication devices has increased astronomically over the last several years. The penetration of cellular telephones and smartphones (the latter now over 50% in the United States and 1.76 billion people worldwide) in modern society has continued to drive demand for other types of networked devices in a wide variety of environments. Such devices and diverse environments may include sensors in wearable devices, mechanical equipment and devices such as heavy equipment, vehicles and vending machines, and clothing.

A vast majority of wireless electronic devices, whether or not networked communication devices, use one or more batteries to provide the energy for the desired functionality. In certain environments and for certain devices, however, the use of a battery is not optimal as proper operation of the device depends on the battery being replaced periodically. Moreover, batteries powering displays or electronic applications employing complex calculations or wireless communications may discharge relatively quickly. Devices in such environments typically contain batteries that are non-rechargeable, but even rechargeable batteries are eventually replaced. The electronic devices, unfortunately, may be permanently installed in locations in which it is inconvenient to replace the battery or the battery is incapable of being replaced. One example of such an environment may be tires, into which tire sensors are placed. In these environments, it may be desirable to generate energy to power communication circuitry using a physical mechanism, such as a piezoelectric device, that is able to reliably convert mechanical energy into electrical energy. This allows the energy provider to be replaced only if a catastrophic issue occurs.

A piezoelectric device generates a small voltage in response to mechanical deformation of the piezoelectric device. Piezoelectric devices may employ deformable crystals and come in a multitude of sizes and shapes, such as relatively thin films that are able to be worked into a number of different environments. The energy generated by piezoelectric devices is small, however. In terms of wireless devices, the instantaneous energy generated is typically unable to power wireless communications, that is, it is insufficient to power the communications for an amount of time used by such communication devices to transmit/receive data. While storage of the energy may permit the energy generated to be used in a desired manner, issues remain in both effective storage of the instantaneously generated energy as well as power management of the stored energy.

It would be desirable to improve energy storage and power management in low power electronics, in particular, electronics in which the voltage is generated intermittently without the use of a battery.

SUMMARY

The present application generally describes a kinetic energy generator, system and method of transmitting data. In Example 1, an energy converter configured to external energy initiated by a user and generate a voltage dependent on the received external energy, a rectifier connected with the energy converter configured to rectify voltage from the energy converter to provide a DC voltage; and a plurality of different types of capacitors formed from different materials connected with the energy converter through the rectifier to receive the DC voltage.

In Example 2, the subject matter of Example 1 can optionally include that the energy converter is a kinetic energy generator comprising a piezoelectric element configured to receive kinetic energy initiated by a user and generate a voltage dependent on the received kinetic energy and the capacitors comprise ceramic capacitors and tantalum capacitors.

In Example 3, the subject matter of one or any combination of Examples 1-2 can optionally include that the capacitors are connected in parallel such that an energy storage profile of a capacitive system formed by the plurality of capacitors has an intermediate substantially quadratic profile between energy storage profiles of the different types of capacitors throughout an entirety of a voltage range.

In Example 4, the subject matter of one or any combination of Examples 1-3 can optionally include that the energy storage profile of the capacitive system has an inflection point at which the energy storage profile of one type of the capacitors dominates below the inflection point and the energy storage profile of another type of the capacitors dominates above the inflection point.

In Example 5, the subject matter of one or any combination of Examples 1-4 can optionally include a load connected with the plurality of capacitors, the load configured to be activated in response to energy storage in the plurality of capacitors reaching a predetermined level.

In Example 6, the subject matter of one or any combination of Examples 1-5 can optionally include that the load comprises a short-range transceiver configured to transmit data to an external device through an antenna in response to the energy storage in the plurality of capacitors reaching the predetermined level.

In Example 7, the subject matter of one or any combination of Examples 1-6 can optionally include that the short-range transceiver is a Bluetooth transceiver.

In Example 8, the subject matter of one or any combination of Examples 1-7 can optionally include that a non-volatile memory configured to provide at least some of the data transmitted by the short-range transceiver in response to a request from the short-range transceiver.

In Example 9, the subject matter of one or any combination of Examples 1-8 can optionally include that the non-volatile memory is configured to provide to the short-range transceiver static data that does not change between transmissions by the short-range transceiver and dynamic data that changes between transmission by the short-range transceiver.

In Example 10, the subject matter of one or any combination of Examples 1-9 can optionally include that the static data includes data pertaining to an article of manufacture in which that does not change between transmissions by the short-range transceiver and dynamic data that changes between transmission by the short-range transceiver.

In Example 11, a system comprises a capacitive system comprising plurality of different types of capacitors formed from different materials and connected in parallel such that an overall energy storage profile of the capacitive system has an inflection point in which below the inflection point the capacitive system stores more energy than a first capacitive system consisting of a first of the types of capacitors arranged in the same manner as the capacitive system and less energy than a second capacitive system consisting of a second of the types of capacitors arranged in the same manner as the capacitive system, and above the inflection point the capacitive system stores more energy than the second capacitive system and less energy than the first capacitive system, and a load connected with the capacitive system, the load configured to be provided energy by the capacitive system in response to the capacitive system storing a predetermined threshold energy below the inflection point.

In Example 12, the subject matter of Example 11 can optionally include that the capacitive system comprises ceramic capacitors and tantalum capacitors.

In Example 13, the subject matter of one or any combination of Examples 11-12 can optionally include that the capacitive system comprises ceramic capacitors and tantalum capacitors.

In Example 14, the subject matter of one or any combination of Examples 11-13 can optionally include a detector coupled with the capacitive system configured to determine a voltage stored by the capacitive system and, in response to detecting that the voltage stored by the capacitive system has reached the predetermined threshold energy, configured to trigger at least some of the stored energy in the capacitive system to be delivered to the load.

In Example 15, the subject matter of one or any combination of Examples 11-14 can optionally include that the load comprises a short-range transceiver configured to transmit data to an external device through an antenna in response to the energy storage in the plurality of capacitors reaching the predetermined level.

In Example 16, the subject matter of one or any combination of Examples 11-15 can optionally include that a non-volatile memory configured to provide at least some of the data transmitted by the short-range transceiver in response to a request from the short-range transceiver, wherein the data comprises static data that does not change between transmissions by the short-range transceiver and dynamic data that changes between transmission by the short-range transceiver.

In Example 17, the subject matter of one or any combination of Examples 11-16 can optionally include that the system is disposed within a shoe.

In Example 18, a method of transmitting data, the method comprises: charging a capacitive system, the capacitive system comprising plurality of different types of capacitors formed from different materials and connected in parallel such that an overall energy storage profile of the capacitive system has an inflection point in which: below the inflection point the capacitive system stores more energy than a first capacitive system consisting of a first of the types of capacitors arranged in the same manner as the capacitive system and less energy than a second capacitive system consisting of a second of the types of capacitors arranged in the same manner as the capacitive system, and above the inflection point the capacitive system stores more energy than the second capacitive system and less energy than the first capacitive system, detecting whether the capacitive system has been charged to a threshold voltage sufficient to activate a short-range transmitter; and in response to detecting that the voltage of the capacitive system has reached the threshold voltage, transmitting the data.

In Example 19, the subject matter of Example 18 can optionally include in response to detecting that the voltage of the capacitive system has reached the threshold voltage, requesting dynamic and static data, wherein the data transmitted comprises the dynamic and static data.

In Example 20, the subject matter of one or any combination of Examples 18-10 can optionally include that continuing to intermittently transmit the data as long as the voltage of the capacitive system continues to be above the threshold voltage; and in response to detecting that the voltage of the capacitive system has fallen below a minimum voltage, terminating transmission of the data and shutting down at least some electronics associated with the transmission.

BRIEF DESCRIPTION OF THE FIGURES

In the figures, which are not necessarily drawn to scale, like numerals may describe similar components in different views. Like numerals having different letter suffixes may represent different instances of similar components. The figures illustrate generally, by way of example, but not by way of limitation, various embodiments discussed in the present document.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

As above, reliable conversion of mechanical and other types of energy into electrical energy and storage of the electrical energy may be an issue with low power devices. This may be particularly the case when the low power devices and associated electronics are disposed within a relatively compact physical space or has other limitations. For example, the balance between low cost components in devices and detrimental effects of using such components may present an issue. As described below, the use of only one type of capacitor to store the generated energy may result in a disadvantageous energy storage profile at across at least a portion of the entire range of energy being stored. The present disclosure describes a new capacitive arrangement to overcome such an issue.

Figure 1:
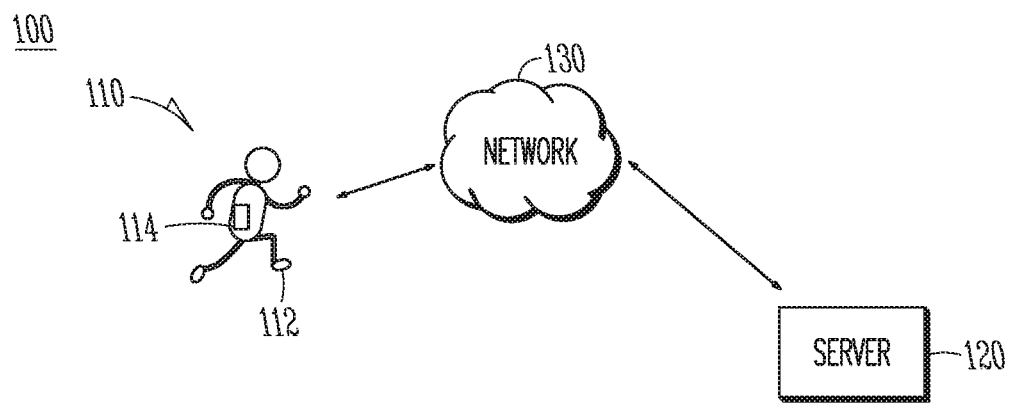
FIG. 1 illustrates one embodiment of a system according to one embodiment.

FIG. 1 is a simplified functional diagram that illustrates an exemplary system 100. The system 100 in FIG. 1 may include a server 120 with which one or more communication devices 112, 114 of an individual 110 may communicate through a network 130. Although not shown, the network may comprise a core network and one or more radio access networks (RANs). Other communication devices may communicate through the network but are not illustrated for convenience. The network 130 may contain or otherwise facilitate communications of a device with the core network, radio access network, public packet switched data communication network (e.g., the Internet) and private packet networks (e.g., intranets). The network 130 may be configured to manage communications throughout the network 130 such as between individual devices, or devices and other destinations such as servers (e.g., content or billing servers).

In general, the network 130 may provide throughput for a variety of data (or control) services such as content downloads, uploads, web browsing, email, streaming of digital multimedia content, etc. The network 130 may be implemented as a network conforming to any of the applicable standards for public mobile wireless communications. Examples of the various communication standards include 3rd Generation Partnership Project (3GPP), Code Division Multiple Access (CDMA) and Orthogonal Frequency-Division Multiple Access (OFDMA) network technologies such 3GPP Long Term Evolution (LTE) and LTE advanced (LTE-A). The network may include mobility management entity (MME), serving gateway (serving GW), and packet data network gateway (PDN GW), for example. The RAN may include a radio network controller (RNC) and Evolved Node-B's (eNBs) or other base stations (BS) for communicating with various devices. Each base station may have several antennae mounted on a radio tower to provide radio frequency (RF) communication access within a cell.

The network 130 may comprise devices that provide short and long range network connectivity. For example, the eNBs may include macro eNBs and low power (LP) eNBs. The eNBs (macro and micro) may terminate the air interface and may be the first point of contact for the communication devices 112, 114. The network 130 may also or instead include short range transceivers, such as transceivers that communicate using Bluetooth, WiFi or Zigbee. For example, the network 130 may include a local network containing repeaters and access points (APs) that provide WiFi service within the vicinity. Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, a Long Term Evolution (LTE) family of standards, a Universal Mobile Telecommunications System (UMTS) family of standards, peer-to-peer (P2P) networks, among others. In some embodiments the communication device 112 may communicate directly with the network 130, while in other embodiments the communication device 112 may be coupled, either wirelessly or through a wired connection with another communication device 114 possessed by the individual 110. Thus, for example, the communication device 112 may be disposed, for example, in a sneaker or other type of shoe or garment of the individual 110.

The communication device 112 may not have a transceiver capable of communicating with the base station, due to not being able to communicate using the appropriate standard and/or due to a limited range that is incapable of communicating with the base station or even a short range device such as an access point. In some embodiments, the communication device 112 may be limited to only one type of short range communication, such as Bluetooth. The communication device 112, however, as above, may be wirelessly and/or physically coupled to and in communication with another communication device 114 located on the person of the individual. The other communication device 114 may be able to communicate using longer range communications of various types (e.g., using LIE or WiFi). Thus, the communication device 112 may communicate with the network through the other communication device 114, in some embodiments using different communications protocols. The communication devices 112, 114 may thus communicate using short range communications such as Bluetooth or through device-to-device (D2D) communications directly or using network-mediated sessions. The other communication device 114 may be a personal mobile device such as a portable handset, smart-phone, tablet computer, or personal digital assistant (PDA).

Figure 2:
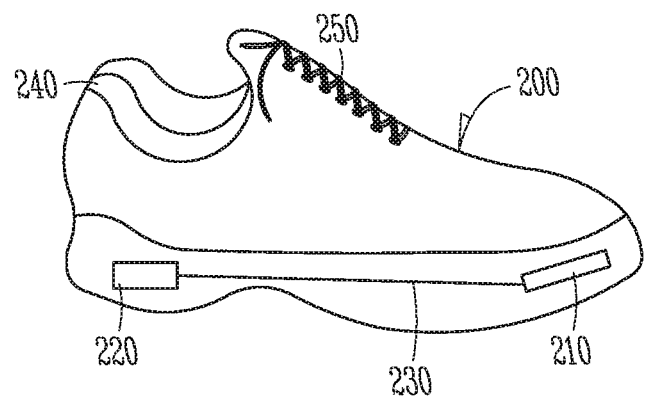
FIG. 2 illustrates a shoe in accordance with one embodiment.

FIG. 2 illustrates a shoe 200 that contains electronics including an energy generator (which may be a piezoelectric element) 210 along with supporting circuitry 220 connected through a wired connection 230. Other portions of the shoe 200, such as a sole and insole provided on the sole are not shown for convenience. The circuitry 220, along with the piezoelectric element 210, may permit bursts of wireless communication to be generated over an extended period of time without use of an embedded battery. The piezoelectric element 210 may have a relatively high modulus of elasticity, with a relatively linear response over an extended range, with respect to compression (depending on the material and fabrication—transverse, longitudinal or shear). A voltage output by the piezoelectric element 210 may be directly proportional to the applied force, pressure, or strain. The piezoelectric element 210 may be formed from a piezoelectric ceramic, such as PZT, or a single crystal material such as quartz or tourmaline. The piezoelectric element 210 may have a high output impedance, which permits efficient energy transfer (harvesting) as described in more detail below. Although only one piezoelectric element 210 is shown in FIG. 2, the piezoelectric element 210 may have separate piezoelectric elements connected, for example, in parallel to generate the power used for the circuitry 220. If multiple piezoelectric elements are present, they may have the same shape or may be different elements, dependent, e.g., on placement within the shoe 200.

As shown, the circuitry 220 may be provided in the heel of the shoe 200, under the sole. The piezoelectric element 210 may be provided in the vamp, near the toes or balls of the shoe 200 and between the sole and insole. The piezoelectric element 210 may in other embodiments be provided near the heel of the shoe 200 between the sole and insole. In some embodiments, the piezoelectric element 210 may include individual elements disposed at different locations within the shoe 200 that are all connected to an energy storage device. The piezoelectric element 210 may generate power when the shoe 200 is in use, e.g., when the wearer is walking or running or otherwise moving his/her feet. The piezoelectric element 210 may be a thin film-type piezoelectric element that is provided between the sole and the insole. However, the placement of the various electronic components is merely exemplary. For example, in some embodiments, the circuitry 220 and piezoelectric element 210 may be collocated, e.g., due to space considerations. In other embodiments, the circuitry 220, rather than being disposed in the heel area of the shoe 200 (surrounded by rubber) may be disposed in an ankle area 240 or tongue 250 of the shoe 200. In some embodiments, the circuitry 220 may be disposed in multiple areas of the shoe 200. For example, in other embodiments, the circuitry 220 may be disposed in an ankle area 240 or tongue 250 of the shoe 200. The area in which the piezoelectric element 210, circuitry 220 and/or wired connection 230 is disposed may be reinforced using a material such as rubber or Kevlar that is capable of protecting the electronics and wiring while still being is sufficiently pliable to not appreciable affect the fit of the shoe 200. In some embodiments, the energy generated by the piezoelectric element 210 may be about 20 uJ/step depending on a user's weight when the piezoelectric element 210 is disposed in a shoe as shown. In some embodiments, to optimize energy harvesting, the piezoelectric element (if discrete) may be mounted to a mechanical device such as a cantilever tuned with a variable mass to provide a resonance frequency close to an expected frequency of use. In other embodiments, a sheet of piezoelectric element fibers may be spread out over an area, such as the toe of the shoe.

Figure 3:
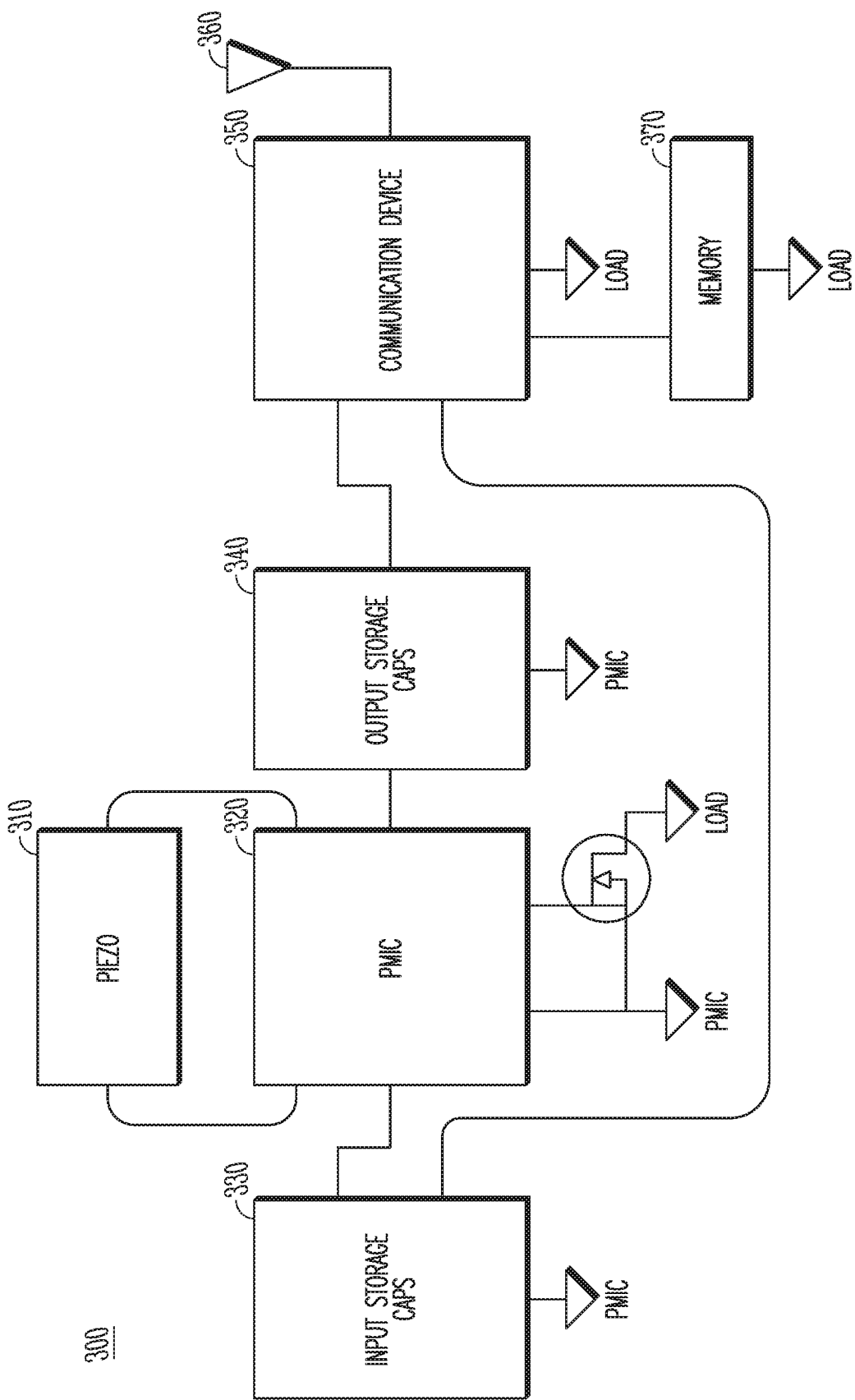
FIG. 3 illustrates a simplified block diagram of the electronics in accordance with one embodiment.

In some embodiments, such as that shown in the block diagram of FIG. 3, the circuitry 220 may include minimal components such as an energy storage system, a wireless communication component, and a controller, among others. For example, the circuitry 220 may include a hardware processor (e.g., a central processing unit (CPU), a GPU, a hardware processor core, or any combination thereof) and a memory (e.g., static), which may communicate with each other via an interlink (e.g., bus). The memory may contain volatile memory or non-volatile memory. In some embodiments, the circuitry 220 may be coupled with one or more remote I/O devices, such as a display, an alphanumeric input device, a navigation device (e.g., a mouse) and a signal generation device 218 (such as a speaker). The circuitry 220 may additionally include or be connected with one or more sensors, such as a global positioning system (GPS) sensor, compass, accelerometer, or other sensor. The circuitry 220 may additionally include a network interface device such as one or more physical jacks (e.g., Ethernet, coaxial, or phone jacks) or one or more antennas to connect to the communications network.

The memory may include a machine readable medium on which is stored one or more sets of data structures or instructions (e.g., software) embodying or utilized by any one or more of the techniques or functions described herein. The instructions may also reside, completely or at least partially, within the memory or within the hardware processor during execution thereof by the circuitry 220. In an example, one or any combination of the hardware processor, the memory, or the memory may constitute machine readable media. The machine readable medium may be a single medium or multiple media (e.g., a centralized or distributed database, and/or associated caches and servers) configured to store the one or more instructions.

The term "machine readable medium" may include any medium that is capable of storing, encoding, or carrying instructions for execution by the circuitry 220 and that cause the circuitry 220 to perform any one or more of the techniques of the present disclosure, or that is capable of storing, encoding or carrying data structures used by or associated with such instructions. Non-limiting machine readable medium examples may include solid-state memories, and optical and magnetic media. Specific examples of machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; and Random Access Memory (RAM). In some examples, machine readable media may include non-transitory machine readable media. In some examples, machine readable media may include machine readable media that is not a transitory propagating signal.

Figure 5A:
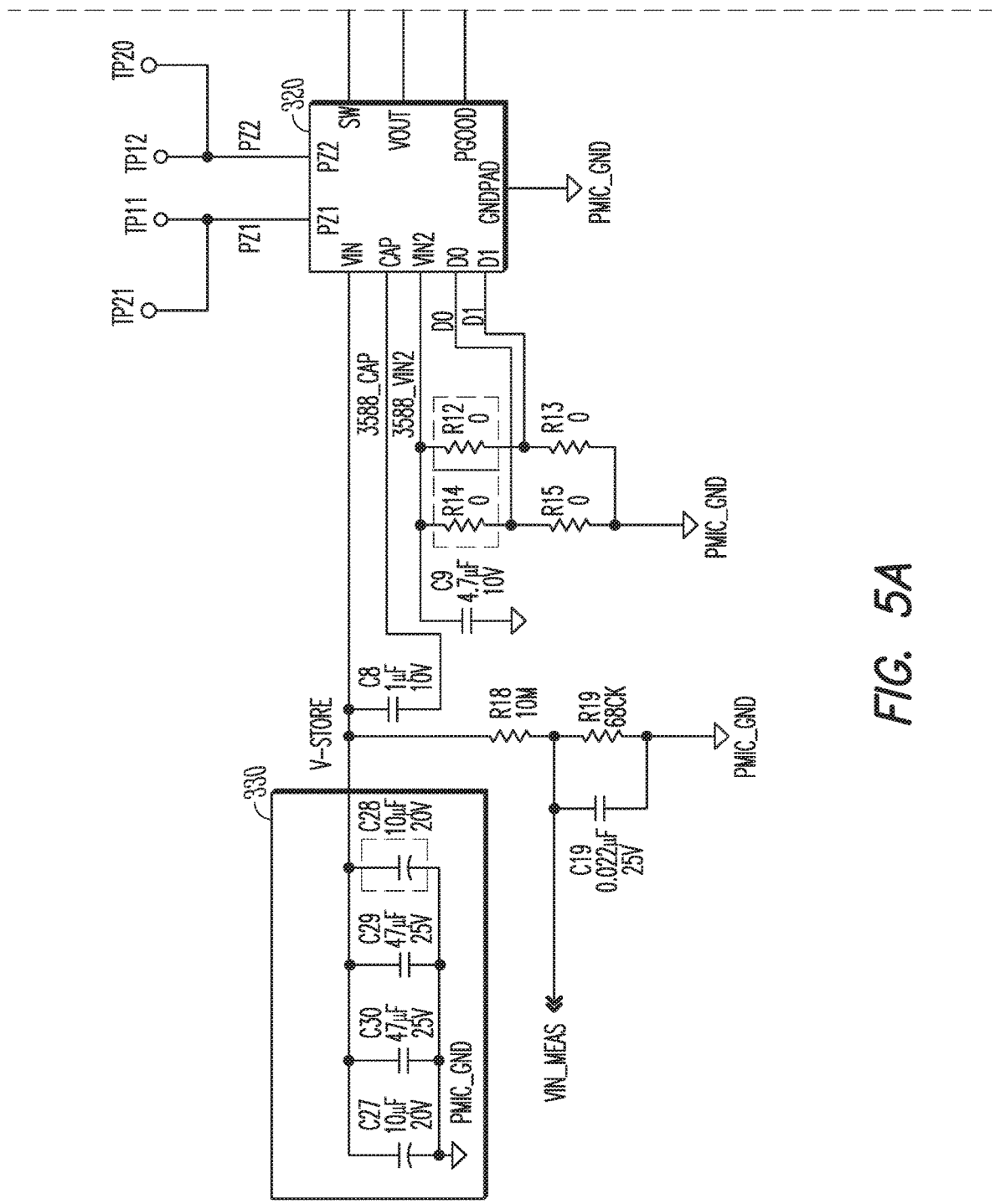
FIGS. 5A and 5B illustrate a schematic of the rectifier and other portions of the electronics of FIG. 2 in accordance with one embodiment.
Figure 5B:
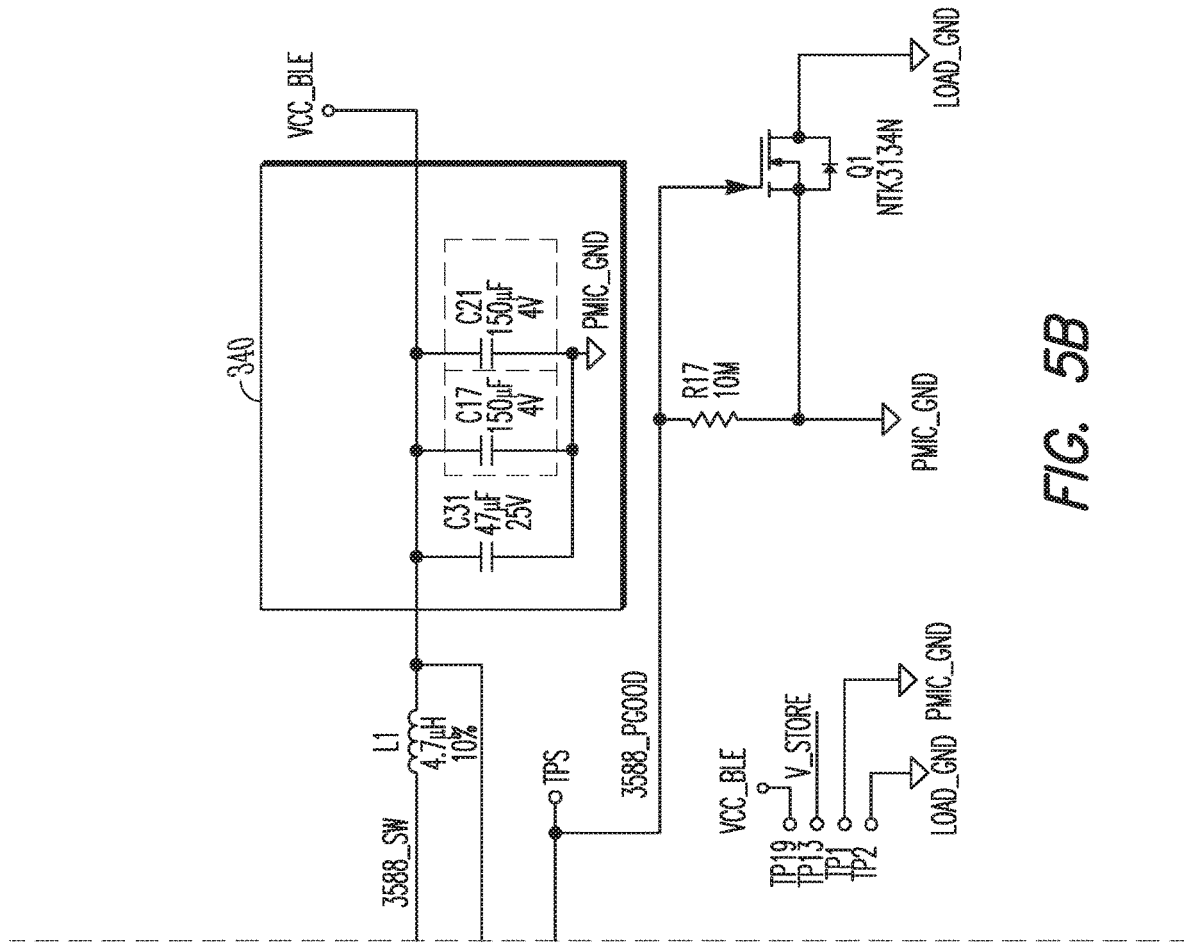
Figure 6A:
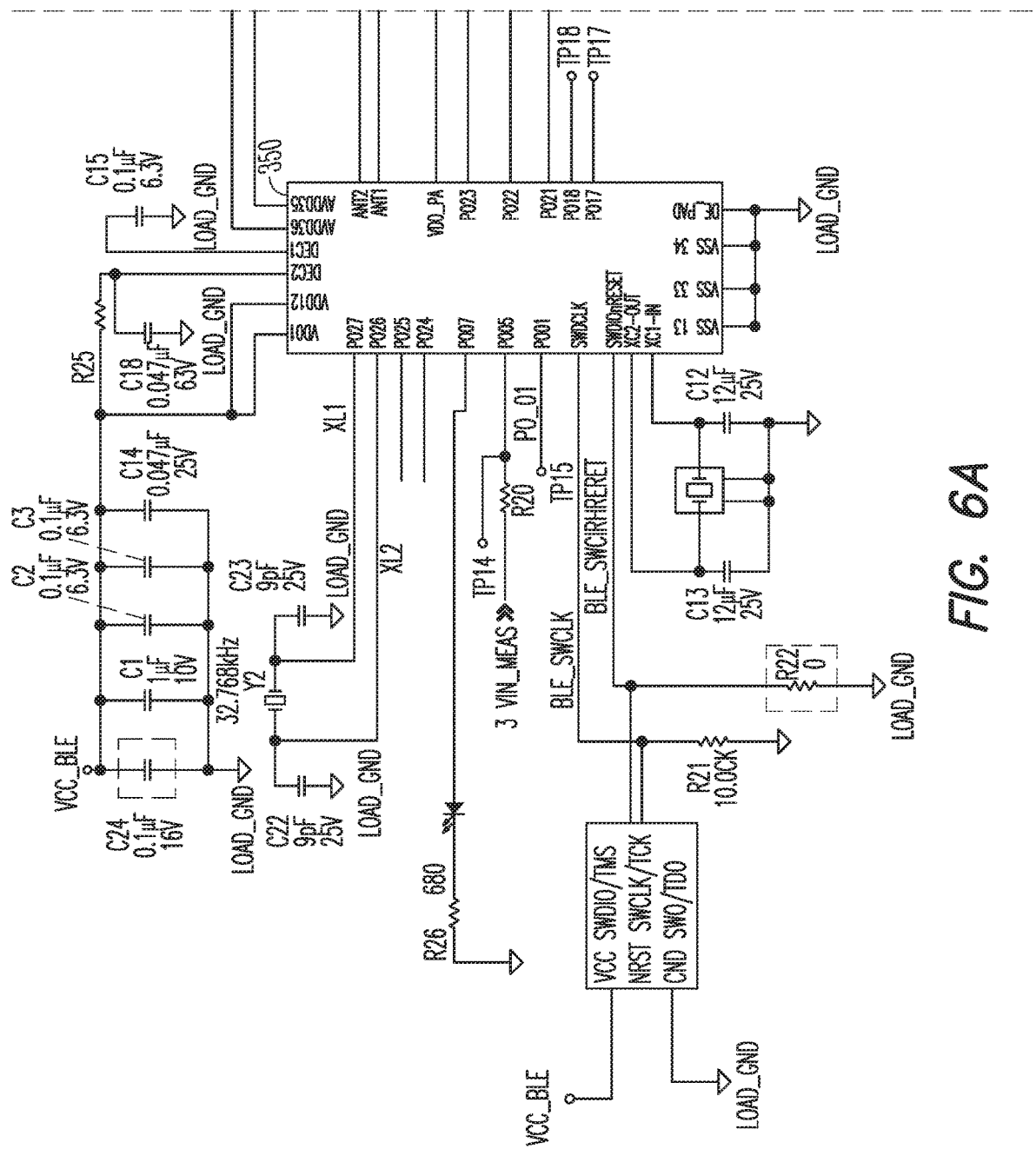
FIGS. 6A and 6B illustrate a schematic of the transmitter and other portions of the electronics of FIG. 2 in accordance with one embodiment.
Figure 6B:
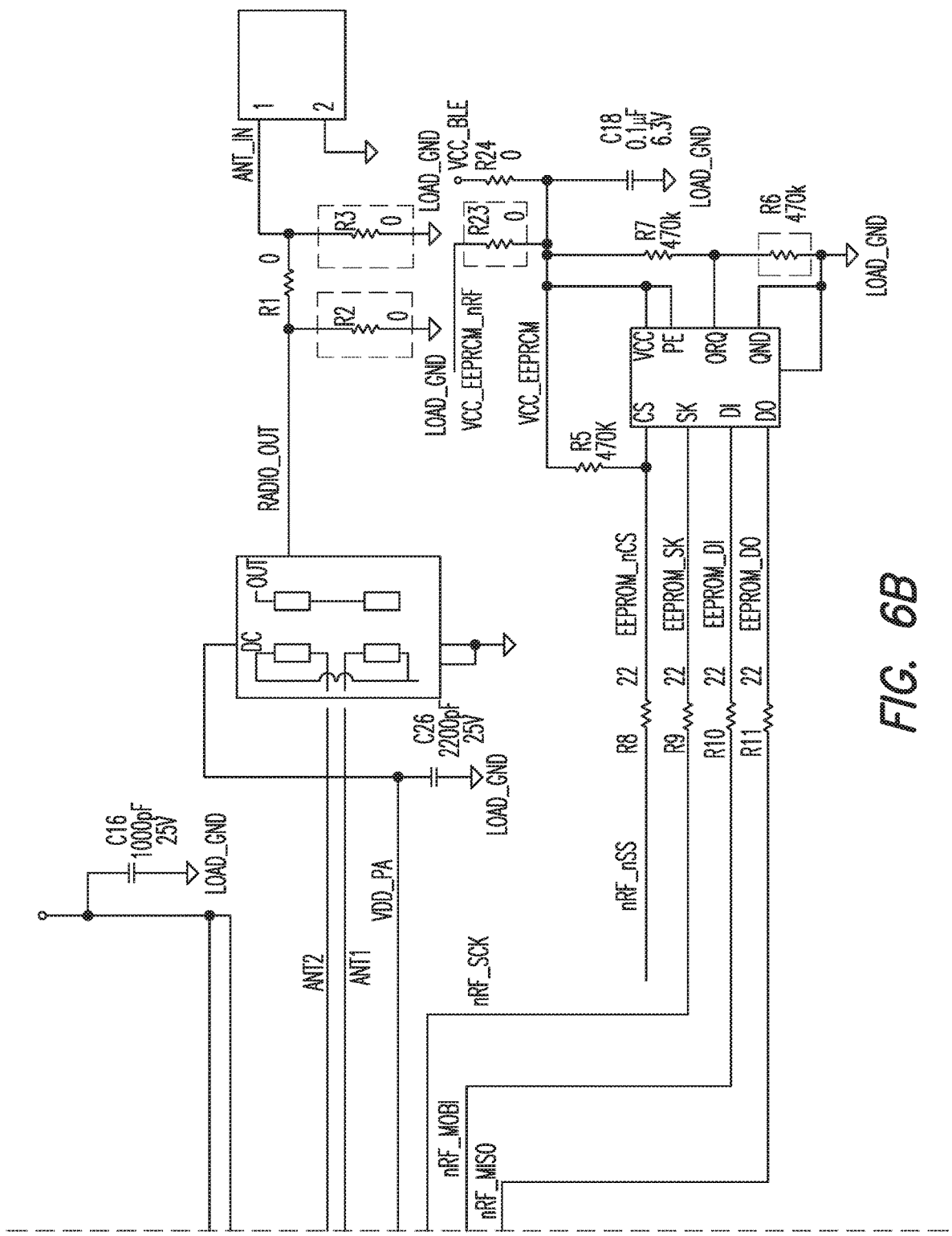

FIG. 3 illustrates a simplified block diagram of the electronics 300 shown in FIG. 2. FIGS. 5A and 5B and 6A and 6B illustrate schematics of the electronics 300 shown in FIG. 3. In particular, FIGS. 5A and 5B illustrate schematics of the rectifier of FIG. 2 while FIGS. 6A and 6B illustrate schematics of the communication device of FIG. 2. The electronics 300 may contain a piezoelectric element 310 whose ends are connected with power management integrated circuit (PMIC) 320. The PMIC 320, in turn, is connected with input storage capacitors 330 and at least one output storage capacitor 340. Both the input and output storage capacitors 330, 340 may be connected with a communication device 350. The communication device 350 may be connected with a memory 370 and communicate wirelessly with the network or other networked devices using one or more antennas 360. In some embodiments, the processor may be formed from one or more of the PMIC 320, the communication device 350 or the memory 370.

In some embodiments, the antenna 360 is specifically designed only for low-power short range communication such as low power Bluetooth. Such an antenna may be used when battery power or an external energy source is unavailable for example due to the power constraints. In other embodiments in which power may be less of an issue, the antenna 360 may communicate using Bluetooth, Zigbee, or WiFi, for example. In some embodiments, if the antenna 360 transmits using a longer range communication standard such as WiFi, 3G or 4G, the antenna may use any of a variety of techniques to communicate. These techniques may include multiple-input and multiple-output (MIMO), multiple-input and single-output (MISO), single-input and multiple-output (SIMO) or single-input single-output (SISO).

The PMIC 320 may comprise a full-wave bridge rectifier having two connections to the ends of the piezoelectric element 310. The PMIC 320 may contain a buck converter that extracts energy of the piezoelectric element 310 and stores the voltage obtained using the input storage capacitors 330. The PMIC 320 may also comprise a voltage converter that converts the corresponding input voltage down to a lower voltage that the digital circuitry can use. This digital voltage is stored at the output storage capacitors 340. In one embodiment, the input voltage may be converted by the PMIC 320 to a lower output voltage, say from an input voltage of 20V to a selectable output voltage of 1.8V. The use of such a rectifier may permit effective harvesting of the piezoelectric element 310 by using the naturally high output impedance of the piezoelectric element 310. Furthermore, in certain embodiments, such as that depicted in FIG. 2, limited space may be available for the circuitry causing the real estate of the circuitry to be a premium. One example of a PMIC that may be used in the circuit depicted in FIG. 3 is a Linear® LTC3588 chip (3×3×1 mm), which has an input operating range of up to 20V.

The input storage capacitors 330 permit the electronics 300 to store energy generated by the piezoelectric element 310 through the PMIC 320 for later use. In particular, the energy generated by the piezoelectric element 310 may be harvested by the PMIC 320 and provided to the input storage capacitors 330, where it may be stored until a sufficient amount of energy is built up to operate the transmitter of the communication device 350 within the electronics 300. Despite the availability of different types of materials, previous examples of energy generators may use one or more capacitors formed from a single type material to store this energy, e.g. for cost considerations. Tantalum and ceramic type capacitors, for example, of the same physical size may be used. The use of capacitors in the configuration shown may result in minimal system hoard space used and reduced cost. In one specific example, a tantalum and ceramic (e.g., paraelectric materials such as $TiO_2$, ferroelectric material such as $BaTiO_3$, etc. ... ) type capacitor of the same physical size may have a nominal capacitance of 10 uF and 47 uF, respectively. The thickness of such a capacitor may be 2-3 mm. A tantalum and ceramic type capacitor may also respectively provide a maximum voltage of 25V and 20V. In one example, the input storage capacitors 330 may be a 1206 size package (3.2×1.6×1.6 mm).

In some embodiments, however, it may be more desirable to use capacitors of different types of materials as the input storage capacitors 330 due to inherent issues related to the changes in capacitance with changing characteristics. For example, the capacitance of certain ceramic capacitors changes with temperature, frequency and even time. Moreover, the capacitance of a ceramic capacitor may also change, sometimes dramatically with ferroelectric capacitors, over the operating voltage of the capacitor. Specifically the capacitance may decrease as a function of increasing voltage. Thus, although the energy stored in a capacitor ideally follows the equation $\frac{1}{2}CV^2$, where C is the capacitance of the capacitor and V is the voltage stored, practical considerations cause the capacitor energy to differ, depending on the voltage, from the ideal energy storage law. Operations in a fairly stable frequency and temperature environment such as the environment depicted in FIGS. 1 and 2 may permit the capacitance to remain constant, and thus, for the other electronics to be relatively unaffected by the capacitive changes. However, the voltage of the input storage capacitors 330 spans the entire range of operational voltage as at some times the piezoelectric may be minimally actuated (such as when the user is sitting or not wearing the shoe) while at other times the user may constantly actuate the piezoelectric (such as while walking or running). As above, assuming 20 uJ/step, a nominal voltage of 3-4 volts may be reached in only about 10 steps. Thus, reaching 20 volts may take only several dozen steps, a relatively small amount considering the average US citizen takes between 5-7K steps per day, with more active people taking 10+K steps each day.

Figure 4A:
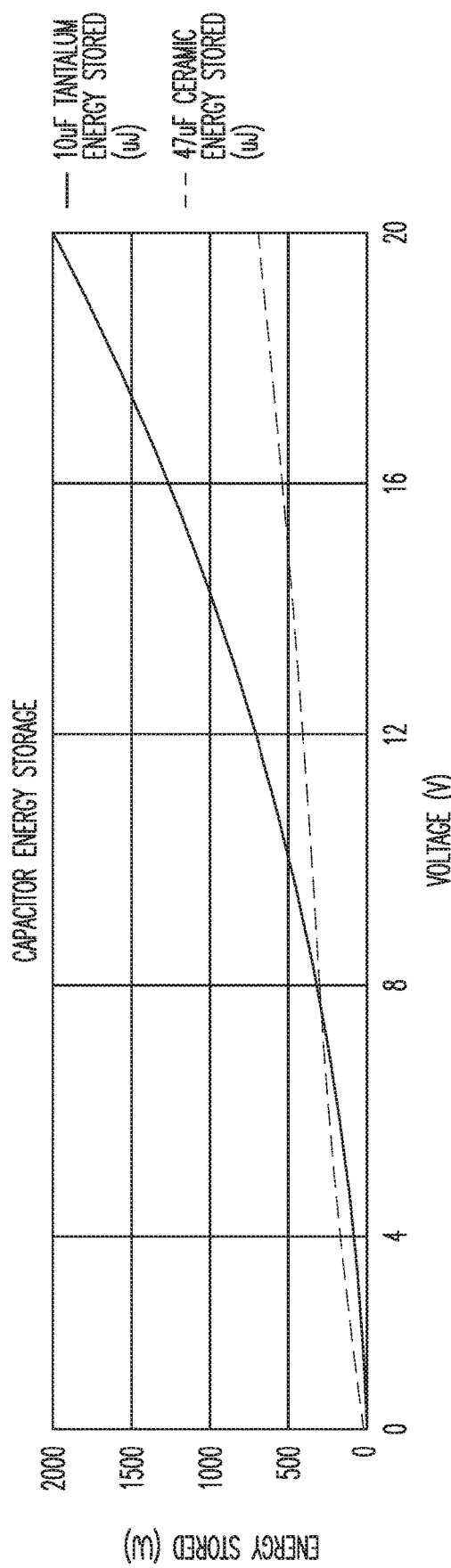
FIGS. 4A-C show diagrams of energy storage in various capacitors in accordance with one embodiment.
Figure 4B:
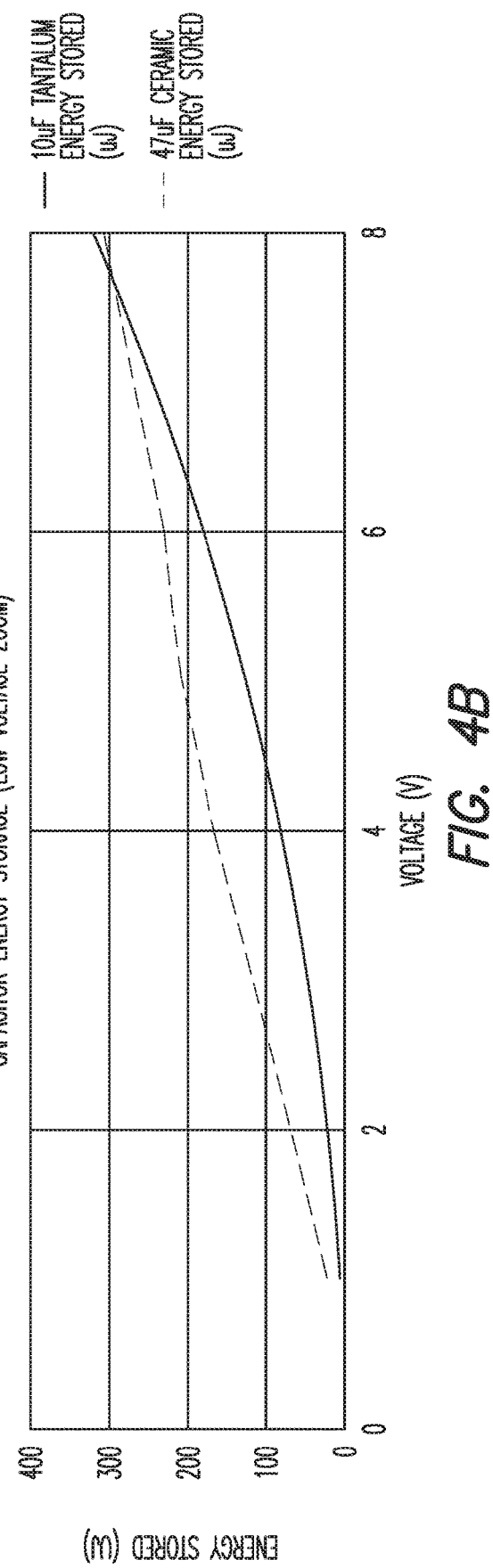
Figure 4C:
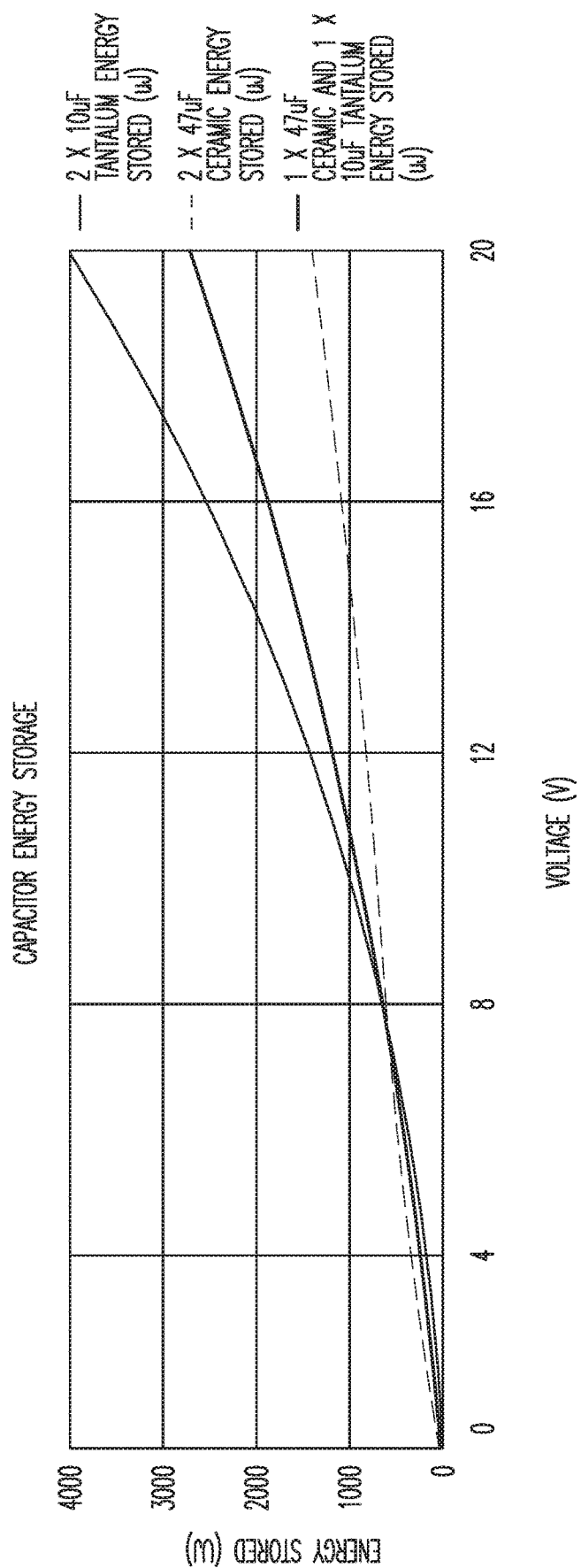

FIGS. 4A-4C illustrate measurements of energy storage of individual capacitors over the range of 0-20V taking the dc bias de-rating of the ceramic capacitor into account. FIG. 4B is a magnification of FIG. 4A at lower voltages. It is apparent that the 10 uF tantalum capacitor and 47 uF ceramic capacitors have different nominal capacitances. As can be seen, the energy stored by the ceramic capacitor increases substantially linearly rather than similar to a square-law increase. Thus, the capacitance of the ceramic capacitor may appear to decrease substantially inversely with voltage. At low voltages, the 47 uF ceramic capacitor has a higher capacitance than the 10 uF tantalum capacitor, and thus dominates the amount of energy stored. At higher voltages, however, the 10 uF tantalum capacitor dominates the amount of energy stored up to a maximum of about 2000 uJ. As shown, the crossover point is about 8V or 300 uJ, i.e., the ceramic capacitor stores more energy at voltages below about 8V and the tantalum capacitor stores more energy at higher voltages up to about 20V.

If the energy storage level to be provided by the input storage capacitors 330 was predictable, the type of capacitor used in the electronics 300 would be able to be optimized to that range. Due to the inherent differences in lifestyles of various individuals and even over the course of different times within day-to-day activities of an individual, the predictability of the energy storage level is limited. In scenarios in which energy is being harvested from a shoe, and the wearer is walking intermittently, it is likely (but not always the case) that the voltage on the input storage capacitors 330 may remain fairly low and the ceramic capacitor thus stores more energy. In continuous movement scenarios, however, the voltage may continue to rise over time and the tantalum capacitor may thus store significantly more energy than the ceramic capacitor. To combat the voltage degradation at higher voltage levels, the input storage capacitors 330 may include a combination of capacitors of different types and that have essentially the same physical size. It may be beneficial to select a combination of capacitors and perhaps in addition or instead a crossover point to benefit the likely widest range of users, or to specialize for different user types/activity levels (e.g., mostly sedentary, intermittently active, continuously active).

As shown, in some embodiments, one or more 10 uF tantalum capacitors may be disposed in parallel with one or more 47 uF ceramic capacitors. In other embodiments, at least one serial combination of the tantalum and ceramic capacitors may be present. In various embodiments, different numbers and combinations (parallel and/or series-connected) of capacitors with different non-ideal CV functionality may be provided. In one specific example, pairs of tantalum and ceramic capacitors may be provided in parallel as the input storage capacitors 330. This permits the energy storage profile to have a substantially quadratic functionality throughout the entirety of the voltage range, intermediate between the two different types of capacitors and with an inflection point, with the ceramic capacitors dominating at lower voltages and the tantalum capacitors dominating at higher voltages. FIG. 4C shows a comparison between the same types of capacitors in parallel and different types of capacitors in parallel. As is apparent from a comparison between FIGS. 4A and 4C, the energy stored by two 10 uF tantalum capacitors is doubled to about 4000 uJ at 20V, the energy stored by two 47 uF ceramic capacitors is doubled to about 1400 uJ at 20V, and the energy stored by the parallel combination of a 10 uF tantalum capacitor and a 47 uF ceramic capacitor is between these values, extending to about 2800 uJ at 20V. This arrangement is shown in the schematic of FIG. 5.

The input storage capacitors 330 may be connected between the rectified DC output of the piezoelectric element 310, provided by the PMIC 320, and ground. In addition, a voltage divider circuit (shown in FIG. 5) may be disposed between the input storage capacitors 330 and ground in parallel with the input storage capacitors 330 to permit measurement of the voltage on the input storage capacitors

330. In one example, the voltage divider circuit may provide a maximum output voltage of about 1.25V at a 20V voltage on the input storage capacitors 330. In addition, a capacitor may be disposed in parallel with the portion of the voltage divider circuit connected with ground such that the RC time constant of the parallel combination of the resistor and capacitor is about 15 ms. The output of the voltage divider may be supplied to the communication device 350 or another controller that monitors the voltage at the input storage capacitors 330 to estimate the energy being harvested from the piezoelectric element 310 and thus determine when the voltage on the input storage capacitors 330 has reached a threshold level to permit transmission.

The output storage capacitors 340 may be connected to the output of the PMIC 320. The output of the PMIC 320 may have multiple selectable voltages levels. The output storage capacitors 340 may be disposed in parallel between the output of the PMIC 320 and ground. In some embodiments, the output storage capacitors 340 may be of the same type (e.g., ceramic), while in other embodiments the output storage capacitors 340 may be of different types. In some embodiments, the output storage capacitors 340 may have the same nominal capacitances, while in other embodiments the output storage capacitors 340 may have different nominal capacitances. The output storage capacitors 340, like the input storage capacitors 330, may be on a power rail that powers the communication device 350. As shown in the schematic of FIG. 5, in one embodiment, the output storage capacitors 340 include multiple capacitors of a single type (ceramic) disposed in parallel. The output storage capacitors 340 have different capacitances, including a 47 uF and several 150 uF, forming an overall capacitance of about 350 uF. In other embodiments, capacitors of one or more other types and/or capacitances may be used in the same or other arrangements.

The communication device 350 may include a Bluetooth transmitter provided in or connected to the shoe. The communication device 350 may in some embodiments both wirelessly transmit data to a connected device (or system) and receive data from the device using the antenna 360, while in other embodiments, the communication device 350 may be capable only of transmitting predetermined data. Once the input storage capacitors 330 retain sufficient charge so that the output storage capacitors 340 reach 3-4 volts or about 200 uJ, the communication device 350 may begin to intermittently transmit signals to the connected device. The communication device 350 may continue to transmit data while the user is in motion, and may continue to transmit data briefly, once the user stops and the piezoelectric element 310 is no longer charging the input storage capacitors 330, until the charge drains on the input storage capacitors 330 to a sufficiently low value to reduce the output energy below 200 uJ. Once the electronics 300 are activated by input storage capacitors 330 retaining sufficient charge to enable transmission, if the user is no longer physically active, the electronics 300 may continue to transmit data until the input storage capacitors 330 discharge, in one embodiment about 10-20 s.

In some embodiments, the data transmitted by the communication device 350 during each transmission may be static (i.e., the same), while in other embodiments, the data transmitted by the communication device 350 during each transmission may be wholly or partially dynamic (i.e., at least some of the data may be new or updated while other data may remain the same). The dynamic data may be determined as soon as, or shortly after, a sufficient amount of charge has been built up in the input storage capacitors 330 to enable transmission by the communication device 350. The data may be stored in the memory 370 and provided to communication device 350 in response to a request from the communication device 350.

Static data transmitted in a particular transmission may include, for example, a semi-unique identifier or a unique identifier. Examples of the semi-unique identifier may include a code identifying one or more specifics of the shoe. The shoe specifics may include the model and the color weigh (e.g., model: Nike Free 4.0 flyknit, color weight: crimson) and/or the location where the shoe was produced (e.g., country, province, factory). The semi-unique identifier may thus limit the range of products available by the vendor to permit the vendor to track product usage in a non-user identifiable manner.

The static data may in addition or instead include a unique ID tied to a particular shoe may identify the vendor and/or store from which the shoe was purchased. In some embodiments, such as when the purchaser has registered the shoe online, the unique ID may also or instead be used to identify the purchaser. In either case, the static data may be programmed into the memory 370 and thus independent of the environmental/user conditions that cause the dynamic data to change.

The dynamic data may include data that is different each time the communication device 350 transmits data via the antenna 360 to an external entity. The dynamic data, rather than being programmed into the memory 370, may be dependent on environmental conditions, such as the time or date, ambient temperature/humidity and/or user conditions, such as the activity of the user, and thus the charging rate. The dynamic data may be dependent on, for example, the number of radio transactions of the shoe, which may correspond to the number of steps taken, or the amount of time the communication device 350 has been active (i.e., harvested enough energy for shoe to be operational). The number of radio transactions of the shoe may be related to the number of steps taken using amount of energy/step for the user (which may be predicted or take into account the weight of the user) and the amount of energy used to transmit the data. In addition to merely counting the number of steps taken, however, the dynamic data may associate static data with the instant dynamic data. In some embodiments, the step count and perhaps associated dynamic information may be stored in non-volatile memory, such as memory 370. The dynamic data may also include storage characteristics of the system, such as remaining charge, and historical information such as charge and power drainage rate without transmission to permit adjustment or redesign of other capacitive setup in other shoes prior to sealing the shoe or making the capacitive setup unable to be adjusted.

The dynamic data may also include positioning data and biological data, which may be obtained from user devices connected with the electronics 300. For example, a GPS transceiver may be disposed in apparel connected with the electronics 300 via a wired connection or a smartphone or smartwatch wirelessly connected with the electronics 300, or embedded in the shoe. Similarly, the biological data may be transmitted wirelessly or through a wired connection to the electronics 300. The biological data may be related to heartrate, blood pressure, etc. Thus, the position and biological conditions of the user may be appended to, or incorporated into the static data and thus may be monitored. For example, a sudden stop (as determined by an accelerometer in or linked to the shoe) or change in orientation (as determined by a gyroscope linked to the shoe) coupled with a precipitous drop in heartrate or blood pressure may automatically trigger an emergency transmission (e.g., a predetermined code) as the final transmission to alert a monitoring station to a potential emergency scenario.

The PMIC 320, in addition to the voltage output connected with the output storage capacitors 340, may also have a logic output (PGOOD in FIG. 5) that may be used to drive an electronic component such as a single n-channel power MOSFET. In particular, the logic output may be connected directly with the gate of the MOSFET and connected to the source of the MOSFET through a high value (e.g., 10 M$\Omega$) resistor. The source of the transistor may also be grounded. The drain of the MOSFET may be connected to a load. The load may include downstream electronics including a controller and memory such as an EEPROM. For example, once the output of the PMIC 320 goes high, the downstream electronics may be activated and the downstream system may be booted, including the communication device 350. In one embodiment, the high output may be 1.8V (selectable via control inputs of the PMIC 320), which occurs when the voltage of the input storage capacitors 330 reaches about 4V at about 4.25 s under constant charging from the piezoelectric element 310, e.g., when walking occurs.

The communication device 350, as shown in FIG. 6, may be a low power Bluetooth transmitter such a Nordic Semiconductor® nRF51822 operating in the 2.4 GHz transmission range. The communication device 305 may be directly connected with a non-volatile memory 370 such as an EEPROM. As shown in FIG. 6, the memory 370 may be a Microchip Technology 93AA76 EEPROM. The communication device 350 may be connected with a whip antenna 360 through a bandpass filter matched to the communication device 350.

Figure 7:
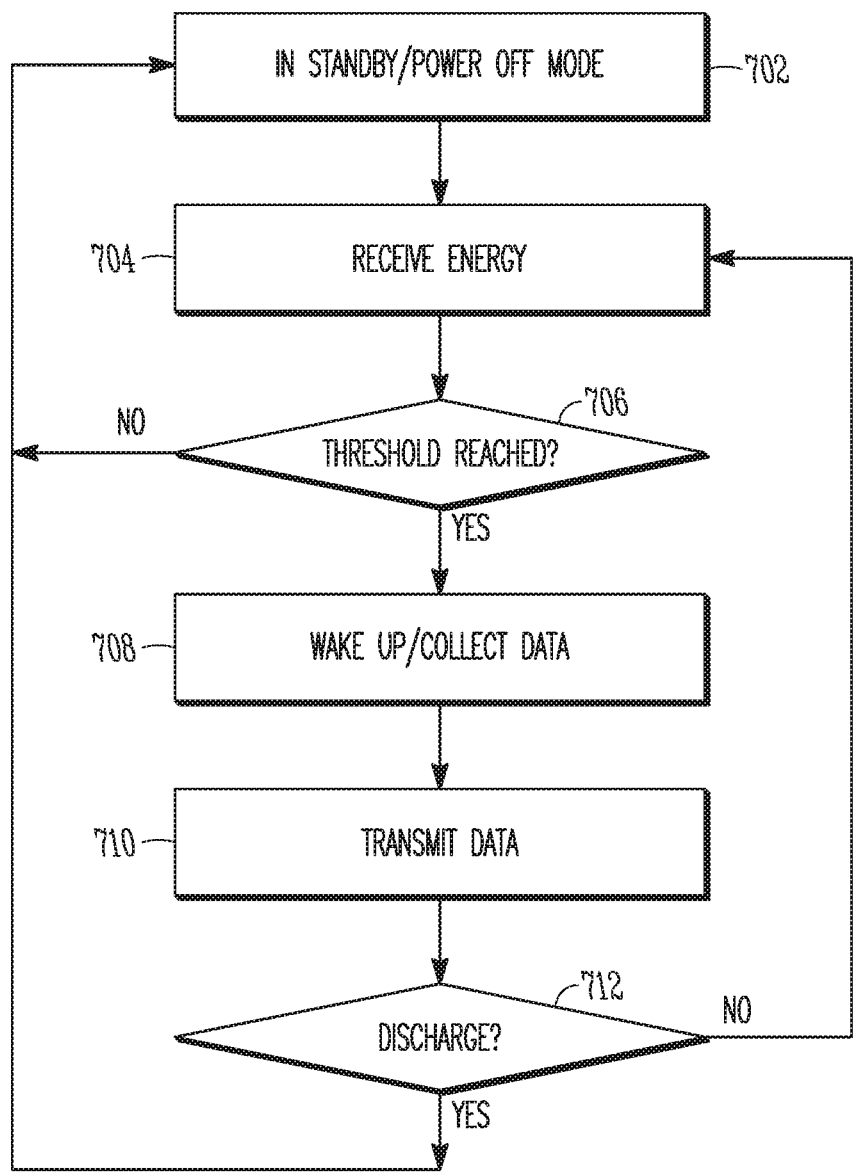
FIG. 7 illustrates a flowchart of transmitting data in accordance with some embodiments.

FIG. 7 illustrates a flowchart of a method of transmitting data in accordance with some embodiments. At step 702, the electronics may be in standby or power off mode. In some embodiments, the electronics may be able to enter standby (low power) mode rather than full power off mode e.g., if a separate battery is used and/or if the piezoelectric is continuing to charge slowly.

At step 704, the piezoelectric element generates an AC voltage, which is rectified by the rectifier to provide a DC voltage. The piezoelectric element may generate the voltage, e.g., by the user walking or running while wearing the shoe in which the electronics are disposed. The energy provided by the DC voltage may be stored by the input storage capacitors.

At step 706, the electronics determine whether the input storage capacitors have stored a threshold amount of energy or voltage. The threshold may be based on the amount of energy used to initiate activation of the transmitter and transmit data to an external device. The threshold may be the minimum amount of energy or may be somewhat larger than the minimum amount of energy. For example, if the amount of energy for transmission is 200 uJ to transmit data, the threshold may be set at 250 uJ or 300 uJ. The threshold may be predetermined or may be configurable. If it is determined that the threshold has not been reached, the electronics may continue in standby/off mode.

At step 708, once the threshold has been reached, the electronics may wake up and collect data for transmission. At step 710 the data is transmitted by the short-range transceiver. The data may include static data and/or dynamic data. The static data may not change between transmissions while the dynamic data may change for every transmission. In some embodiments, some or all of the available data may not be transmitted every transmission. For example, certain static data may only be transmitted during the first transmission after threshold has been reached (and/or the last transmission prior to the electronics shutting down) to reduce the power used by the transceiver.

At step 712 the electronics determines whether the input storage capacitors have reached a sufficient level of discharge to shut down or go into standby mode. The threshold for the energy level may be the same as that for reaching the threshold in step 704 or may differ. If the electronics determines that the input storage capacitors have reached a sufficient level of discharge to shut down or go into standby mode, the process may return to step 702. If the electronics determines that the input storage capacitors have not reached a sufficient level of discharge to shut down or go into standby mode, the process may revert to step 704.

Although the embodiments described above lack a battery, in other embodiments, a small, backup battery (e.g., a lithium cell such as CR927 or CR1025) may be provided, e.g., in the shoe in addition to the piezoelectric element. Use of the battery may be triggered, for example, by manual activation of a user input on the shoe or an electronic device wirelessly coupled with the shoe. The manual activation may initiate a different signal from the shoe, such as an emergency beacon, whose transmission and message is controlled by the processor. This may permit the battery to be used in isolated circumstances rather than being drained for the standard sensor-based transmissions described above. In some embodiments, the battery may be used for other purposes as well, such as providing the energy for flashing lights embedded in the shoe. In other embodiments, the battery may be dedicated for one type (e.g., emergency) of transmission. In further embodiments, although a piezoelectric system with a specific load has been described, the different types of input storage capacitors may be used to provide an energy storage system connected to any type of load and supplied by any type of voltage. In some embodiments, the different types of input storage capacitors may act as a power supply having a voltage input node and that provide an output voltage.

Although an embodiment has been described with reference to specific example embodiments, it will be evident that various modifications and changes may be made to these embodiments without departing from the broader scope of the present disclosure. Accordingly, the specification and drawings are to be regarded in an illustrative rather than a restrictive sense. The accompanying drawings that form a part hereof show, by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, UE, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. An energy generator comprising:
   an energy converter configured to receive external energy and generate a voltage dependent on the received external energy;
   a rectifier connected with the energy converter configured to rectify voltage from the energy converter to provide a DC voltage;
   a plurality of different types of capacitors formed from different materials connected with the energy converter through the rectifier to receive the DC voltage;
   a load connected with the plurality of capacitors, the load configured to be activated in response to energy storage in the plurality of capacitors reaching a predetermined level, the load comprising a short-range transceiver configured to transmit data to an external device through an antenna in response to the energy storage in the plurality of capacitors reaching the predetermined level; and
   a non-volatile memory configured to provide at least some of the data transmitted by the short-range transceiver in response to a request from the short-range transceiver.

2. The energy generator of claim 1, wherein:
   the energy converter is a piezoelectric element configured to receive kinetic energy initiated by a user and generate a voltage dependent on the received kinetic energy, and
   the plurality of capacitors comprises ceramic capacitors and tantalum capacitors.

3. The energy generator of claim 1, wherein:
   the plurality of capacitors are connected in parallel such that an energy storage profile of a capacitive system formed by the plurality of capacitors has an intermediate quadratic profile between energy storage profiles of the different types of capacitors throughout an entirety of a voltage range.

4. The energy generator of claim 3, wherein:
   the energy storage profile of the capacitive system has an inflection point at which the energy storage profile of one type of the capacitors dominates below the inflection point and the energy storage profile of another type of the capacitors dominates above the inflection point.

5. The energy generator of claim 1, wherein:
   the short-range transceiver is a Bluetooth transceiver.

6. The energy generator of claim 1, wherein:
   the non-volatile memory is configured to provide to the short-range transceiver static data that does not change between transmissions by the short-range transceiver and dynamic data that changes between transmission by the short-range transceiver.

7. The energy generator of claim 6, wherein:
   the static data includes data pertaining to an article of manufacture in which that does not change between transmissions by the short-range transceiver and dynamic data that changes between transmission by the short-range transceiver.

8. A system comprising:
   a capacitive system comprising plurality of different types of capacitors formed from different materials and connected in parallel such that an overall energy storage profile of the capacitive system has an inflection point in which:
     below the inflection point the capacitive system stores more energy than a first capacitive system consisting of a first of the types of capacitors arranged in the same manner as the capacitive system and less energy than a second capacitive system consisting of a second of the types of capacitors arranged in the same manner as the capacitive system, and
     above the inflection point the capacitive system stores more energy than the second capacitive system and less energy than the first capacitive system;
   a load connected with the capacitive system, the load configured to be provided energy by the capacitive system in response to the capacitive system storing a predetermined threshold energy below the inflection point; and
   a detector coupled with the capacitive system configured to determine a voltage stored by the capacitive system and, in response to detecting that the energy stored by the capacitive system has reached the predetermined threshold energy, configured to trigger at least some of the stored energy in the capacitive system to be delivered to the load.

9. The system of claim 8, wherein:
   the capacitive system comprises ceramic capacitors and tantalum capacitors.

10. The system of claim 8, wherein:
    the load comprises a short-range transceiver configured to transmit data to an external device through an antenna in response to the energy storage in the plurality of capacitors reaching the predetermined threshold energy.

11. The system of claim 10, further comprising:
    a non-volatile memory configured to provide at least some of the data transmitted by the short-range transceiver in response to a request from the short-range transceiver, wherein the data comprises:
  static data that does not change between transmissions by the short-range transceiver and
  dynamic data that changes between transmission by the short-range transceiver.

12. The system of claim 8, wherein:
the system is disposed within a shoe.

13. A method of transmitting data, the method comprising:
  charging a capacitive system, the capacitive system comprising plurality of different types of capacitors formed from different materials and connected in parallel such that an overall energy storage profile of the capacitive system has an inflection point in winch:
    below the inflection point the capacitive system stores more energy than a first capacitive system consisting of a first of the types of capacitors arranged in the same manner as the capacitive system and less energy than a second capacitive system consisting of a second of the types of capacitors arranged in the same manner as the capacitive system, and
    above the inflection point the capacitive system stores more energy than the second capacitive system and less energy than the first capacitive system;
  detecting whether the capacitive system has been charged to a threshold voltage sufficient activate a short-range transmitter; and
  in response to detecting that the voltage of the capacitive system has reached the threshold voltage, transmitting the data.

14. The method of claim 13, further comprising:
in response to detecting that the voltage of the capacitive system has reached the threshold voltage, requesting dynamic and static data,
wherein the data transmitted comprises the dynamic and static data.

15. The method of claim 13, further comprising:
continuing to intermittently transmit the data as long as the voltage of the capacitive system continues to be above the threshold voltage; and
in response to detecting that the voltage of the capacitive system has fallen below a minimum voltage, terminating transmission of the data and shutting down at least some electronics associated with the transmission.

* * * * *

UNITED STATES PATENT AND TRADEMARK OFFICE
CERTIFICATE OF CORRECTION

PATENT NO. : 10,806,212 B2  
APPLICATION NO. : 15/576893  
DATED : October 20, 2020  
INVENTOR(S) : Malhotra et al.

Page 1 of 1

It is certified that error appears in the above-identified patent and that said Letters Patent is hereby corrected as shown below:

In Column 17, Line 13, in Claim 13, delete "winch" and insert --which-- therefor In Column 18, Line 2, in Claim 13, after "sufficient", insert --to--

Signed and Sealed this
Twelfth Day of January, 2021

Andrei Iancu
*Director of the United States Patent and Trademark Office*